July 26, 1966 R. D. FRENCH ETAL 3,263,184

DIGITAL CONTROLLED VARIABLE FREQUENCY OSCILLATOR

Filed Feb. 26, 1964

INVENTORS
RICHARD D. FRENCH
WILLIAM H. AUSTIN

BY Claude Funkhouser
ATTORNEY

United States Patent Office 3,263,184

Patented July 26, 1966

3,263,184 DIGITAL CONTROLLED VARIABLE FREQUENCY OSCILLATOR

Richard D. French, Linthicum, and William H. Austin, Odenton, Md., assignors, by mesne assignments, to the United States of America as represented by the Secretary of the Navy Filed Feb. 26, 1964, Ser. No. 347,634
3 Claims. (Cl. 331—181)

This invention relates to variable frequency oscillators and, more particularly, to an oscillator circuit having an output frequency that is dependent upon digital logic input information.

Numerous electrical devices require oscillator circuits for operation. Some of these oscillator circuits are required to be maintained at substantially fixed frequencies, therefore, they must be free of frequency drift and hold to substantially a predetermined designed frequency. Even though a crystal oscillator circuit is used and the oscillator components are carefully chosen, usually some frequency drift will occur during warm-up or whenever there is aging of oscillator circuit components. In other applications, it is desirable to have oscillator circuits which may be varied in frequency in order that any one of a number of frequencies in a particular band of frequencies may be readily obtainable. Prior art techniques for varying oscillators so as to shift to another frequency output or to shift an oscillator frequency back to its predetermined designed frequency whenever the oscillator has drifted off frequency have been numerous and have taken many forms.

One common technique in the prior art for varying the output frequency of an oscillator is to vary the capacitance or inductance in the oscillator tank circuit, thus causing a change in the inductance-capacitance ratio which in turn changes the frequency output at the output terminals of the oscillator. This may be done by manual means or automatic means. For example, mechanical linkages may be coupled from movable capacitors or inductors in the tank circuit and these may be moved by motor means controllable at a remote point.

Another prior art technique is to provide a number of tuned tank circuits in the input to the oscillator circuit. Each of these tuned circuits consisting of a specific inductance and capacitance pretuned to a predetermined frequency. A switching means is used to selectively switch each tuned circuit into the oscillator circuit. The switching means may be controlled manually or by motor means.

The prior art devices discussed above have the disadvantage of being expensive, bulky and in many cases they may not provide fine increments of frequency change. Also, automatically adjustable capacitors or inductors usually require complicated mechanical linkages for proper operation. Therefore, it would represent a great advance in the art to have an oscillator which is tunable over a given frequency range electronically and which is adaptable to transistorized circuitry.

It is an object of the present invention to provide an oscillator circuit which is capable of being adjustable over a desired frequency range without the use of mechanical linkages.

It is a further object of the present invention to provide a remotely controlled variable frequency oscillator which is completely electronic in operation.

It is another object of the present invention to provide an oscillator circuit which is variable over a given frequency range and that is remotely controllable.

It is a further object of the present invention to provide a remotely controlled oscillator circuit which is adaptable for use with transistorized circuits.

It is another object of the present invention to provide a variable frequency oscillator which can be controlled by digital signal information.

It is another object of the present invention to provide a transistorized oscillator for varying output frequency in accordance with a digital input signal.

Another object of the present invention is to provide a simple and relatively inexpensive means for varying the frequency of an oscillator by a digital signal.

A further object of this invention is the provision of an apparatus whose output frequency may be shifted above or below a predetermined frequency electronically.

Still another object of the present invention is the provisions of a simple and compact means for controlling the frequency output of a variable frequency oscillator.

Other objects, advantages and novel features of the invention will become apparent from the following detailed description of the invention when considered in conjunction with the accompanying drawings wherein.

Figure 1:
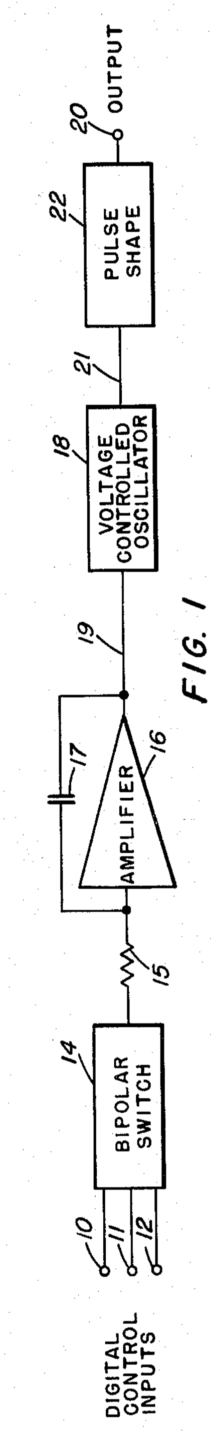
FIG. 1 is a functional block diagram of the circuitry combination of the invention.

Referring to FIG. 1, there is shown a functional block diagram of the various circuitry and their interconnections needed in the present invention. Functional block 14, a bi-polar switch, has input terminals 10, 11 and 12. These terminals are connected to circuitry, not shown, which supplies the necessary digital input voltages to the bi-polar switch 14. The output of bi-polar switch 14 is connected to an integrator circuit 16. The integrator circuit consists of an operational amplifier 16, feedback capacitor 17, and input resistor 15. The output of the integrator circuit is connected via line 19 to voltage controlled oscillator 18. The output of the voltage controlled oscillator is connected via line 21 to the input of pulse shaper circuit 22. The output voltage of the pulse shaper appears at terminal 20.

Figure 2:
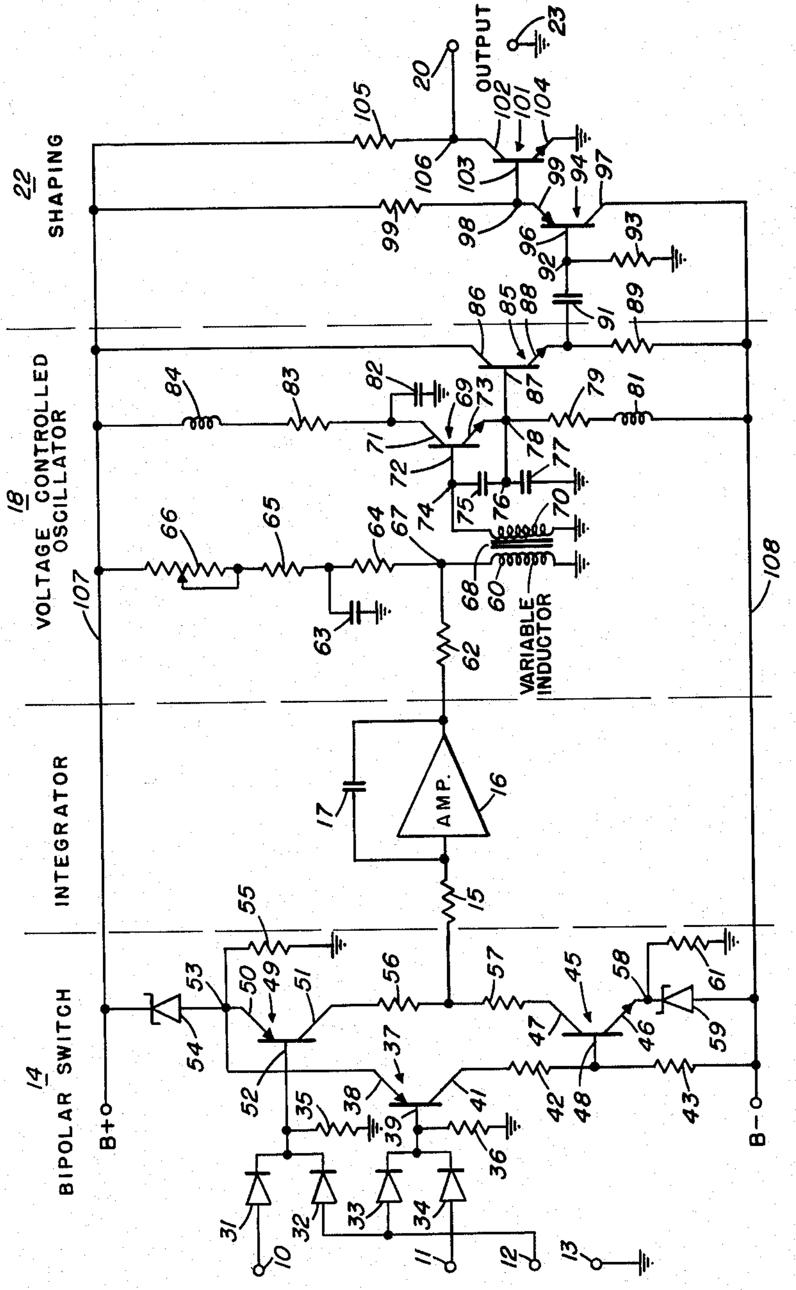
FIG. 2 is a schematic circuit diagram more specifically illustrating the components of the functional block diagram.

Turning now to FIG. 2, which shows with more particularity the schematic parts of the functional blocks of FIG. 1, there is shown a bi-polar switch circuit arrangement generally indicated as 14 which has input terminals 10, 11, 12 and 13, respectively. Four semi-conductors diodes 31, 32, 33 and 34 are connected in circuitry arrangement in the input circuits of two P-N-P transistors 37 and 49, respectively. Input terminal 10 connects to the anode side of diode 31. The cathode side of diode 31 connects to base resistor 35; the other side of resistor 35 being tied to ground potential. Input terminal 11 connects to the anode side of the diode 34. The cathode of diode 34 connects to one side of base resistor 36; the other side of resistor 36 being connected to ground potential. Input terminal 12 ties the anodes of two diodes 32 and 33, respectively, in parallel circuitry arrangement. The cathode side of diode 32 connects to one side of base resistor 35. Diode 33 has its cathode side connected to one side of base resistor 36. P-N-P transistor 49 has base, emitter and collector elements 52, 50 and 51, respectively. Base 52 connects to base resistor 35. The emitter element 50 of transistor 49 is connected to a junction point 53 and junction point 53 is tied to ground potential via resistor 55. A Zener diode 54 is connected to junction 53 at its anode side and to B+ bus 107 at its cathode side. The collector 51 of transistor 49 connects to integrator input resistance 15 via collector resistor 56.

The two diodes 33 and 34, respectively, are tied together at their cathode sides to base resistor 36. P-N-P transistor 37 has base, emitter and collector elements 39, 38 and 41, respectively. Base 39 is tied to ground potential via base resistor 36. The emitter 38 of transistor 37 is connected via an electrical lead to junction 53. Collector 41 is connected via collector resistor 42 and resistor 43 to B— bus 108. Transistor 45 has its base 48 tied between collector resistor 42 and resistor 43. The emitter 46 connects to junction point 58 and junction point 58 is tied to ground potential via a resistor 61. A Zener diode 59 is connected from junction 58 to B— bus 108. The Zener diode has its anode tied to bus 108 and its cathode tied to junction point 58. The collector 47 of the N-P-N of transistor 45 is connected via collector resistor 57 to integrator input resistor 15.

The integrator circuit, which is shown symbolically as an operational amplifier 16 having its output connected via feedback capacitor 17 to its input, is merely of the conventional type and therefore is not shown in any detail. The output side of the integrator circuit is connected to variable inductor 68 via a resistance 62. The variable inductor has a primary winding 60 and a secondary winding 70. The primary winding 60 has one end connected to ground potential and its other end connected to B+ bus 108 via voltage divider resistors 64, 65 and 66, respectively. One side of a bypass capacitor 63 is tied between the two voltage divider resistors 64 and 65; the other side being connected to ground potential.

The voltage controlled oscillator circuit, generally represented as 18, comprise two N-P-N transistors 69 and 85. The secondary winding 70 of variable inductor 60 connects to junction point 74; the other side being connected to ground potential. Two capacitors 75 and 77 are tied in series arrangement from junction 74 to ground potential. The base 72 of transistor 67 is also tied to junction 74. The collector 71 connects to B+ bus 107 via collector resistor 83 and RF choke 84. One side of a bypass capacitor 82 connects to the collector 71; its other side being connected to ground potential. The emitter 73 connects to junction 78. Junction 78 is electrically connected to junction 76 which is between the two capacitors 75 and 77. Junction 78 connects to base 87 of N-P-N transistor 85 and also connects to B— bus 108 via resistor 79 and RF choke 81. The collector 86 is tied directly to B+ bus 107. The emitter 88 is connected to B— bus 108 via resistance 89. The output of voltage control oscillator is taken from between emitter 88 and resistor 89.

The pulse shaping network, generally indicated as 22, has a P-N-P transistor and a N-P-N transistor 94 and 101, respectively, connected in circuitry arrangement. Coupling capacitor 91 connects from emitter 88 to junction point 92. A base resistor 93 connects at one side to junction 92; its other side being at ground potential. Also tied to junction 92 opposite the ground connections is the base 96 of P-N-P transistor 94. The collector 97 is tied directly to B— bus 108. The emitter 99 connects to junction point 98. Junction point 98 is tied to B+ bus 107 via an emitter resistance 99. Base 103 of N-P-N transistor 101 is tied to junction 98. The collector 102 is tied to junction 106. A collector resistance 105 is connected between junction 106 and B+ bus 107. The emitter 104 of transistor 101 is tied directly to ground potential. The output terminal 20 is connected to junction 106. The output appears across terminal 20 and ground terminal 23.

Generally, the operation of the circuitry of the instant invention is such that a digital signal received at the input terminals of the bi-polar switch causes a current to flow through variable inductor 68 thus changing the inductance of the oscillator tank circuit which in turn changes the inductance-capacitance ratio of the tank circuit and the oscillator shifts frequency above or below the predetermined design center frequency.

The above operation is accomplished by the bi-polar switch 14 and the interrogator circuitry. The bi-polar switch circuitry has the properties of allowing a positive voltage output appearing at the input of integrator resistor 15, whenever a positive voltage is placed on terminal 11 and no voltage present on terminals 10 and 12. In order to produce a negative voltage at the input to the integrator circuit, positive voltage is placed on terminal 10 with zero voltages on terminals 11 and 12. If no voltage is desired at the input to the integrator circuit, one of two possible voltage combinations may be placed across the input terminals 10, 11 and 12, respectively. The first combination of voltage has positive voltage on terminals 10 and 12 with no voltage on terminal 11. The second combination requires positive voltage on terminals 11 and 12 with no voltage present on terminal 10. With these conditions on the input terminals, no output voltage will be present at the integrator input resistor 15 and the current will not change through the variable inductor 68. Thus, the inductance remains at its fixed value and no frequency shift will occur.

The integrator circuit is designed so that it will sweep negative for a positive voltage input and sweep positive for a negative voltage input. In the case of no voltage at the input to the integrator circuit, the output voltage will hold at a predetermined fixed value. Since the integrator circuit output varies above and below a fixed voltage, the integrator output voltage controls the frequency of the voltage controlled sinewave oscillator within a frequency range above and below the predetermined oscillator frequency.

With reference to FIG. 2, assume that it is desired to have the output frequency across terminals 20 and 23 decreased. For this condition the following voltage combinations on the input terminals 10, 11 and 12 are necessary.

Terminal 10—0 volt
Terminal 11—+volt
Terminal 12—0 volt

The diode 34 becomes forward biased by the positive voltage on terminal 11 and a current will flow through the diode 34 to the base circuit of transistor 37 causing transistor 37 and transistor 45 to be in a cut-off condition. Transistor 49 is in saturation and allows a positive current to flow through collector-resistor 56 and integrator input resistor 15. With a positive voltage present in its input, the integrator circuit output voltage will sweep negative. The decrease in the integrator output voltage causes a decrease in the current flowing through resistor 62 to the primary 60 of the current controlled variable inductor. A reduction in positive current in the primary 60 increases the inductance of the secondary winding 70. An increased inductance in the tank circuit of the oscillator causes a lowering of the frequency at which the tank circuit is resonant. The oscillator circuit now will oscillate at the new frequency and the new sinusoidal voltage will appeart at the coupling capacitor 91 at the input to the wave shaper circuit 22.

Now assume that it is desired to have the output frequency across terminals 20 and 23 increased. For this condition it is necessary to have the following voltage combinations on the input terminals 10, 11 and 12.

Terminal 10—+ volt
Terminal 11—0 volt
Terminal 12—0 volt

The diode 31 is forwarded biased by the positive voltage on terminal 10 and a current will flow through diode 31 to the base circuit of transistor 49 causing the transistor to be in a cut-off condition. With no voltages present on terminals 11 and 12, transistor 37 and transistor 45 remain in a saturated condition. Current through transistor 45 allows a net negative current to flow through collector resistor 57 and integrator input resistor 15. With a negative voltage present at its input the integrator circuit output voltage will sweep positive. The increase in integrator output voltage causes an increase in the current flowing through resistor 62 to the primary 60 of the current controlled inductor. An increase in positive current in the primary 60 decreases the inductance of the secondary winding 70. A decreased inductance in the tank circuit of the oscillator raises the resonant frequency of the tank circuit. The oscillator now will oscillate at the new higher frequency and an output will appear at the coupling capacitor 91 at the input to the wave shaper circuit 22.

Finally, assume that it is desired to have no frequency change across the output terminals 20 and 23. For this condition to exist it is necessary to have the following voltage combinations on the input terminals 10, 11 and 12.

1.

Terminal 10—0 volt
Terminal 11—+volt
Terminal 12—+volt

2.

Terminal 10—+ volt
Terminal 11—0 volt
Terminal 12—+ volt

The operation of the circuity with the first condition present on the input terminals will be explained. Explanation of the second condition will not be made since the operation is similar in many respects. The two diodes 34 and 32 are forward biased by the positive voltage present on terminals 11 and 12 and currents will flow through them and to the two base circuits of transistors 37 and 49, respectively. All the transistors 39, 49 and 45 will go into cut-off, thus allowing intergrator circuit to see an open circuit. With a net current into the integrator circuit of zero, the voltage output of the integrator does not change. The results are that a fixed current continues flowing into the variable inductor primary 60. No change in oscillator tank circuit will occur and the tank circuit will remain at its resonant frequency. The oscillator continues to oscillate at its predetermined designed frequency and this frequency will appear at the input to the wave shaper circuit 22.

The voltage controlled oscillator output from N-P-N transistor 85 is fed into a two-stage wave shaping circuit comprising a P-N-P transistor 94 and a N-P-N transistor 101 to give a square wave output across the output terminals 20 and 23. The circuit amplifies and prevents the output of any portion of the sinusoidal electrical signal below a prescribed amplitude.

It will now be readily apparent that the instant invention provides a circuitry arrangement which upon the reception of digital logic at the input terminals will give a square wave output at the output terminals. This square wave output is capable of being electronically varied above and below a predetermined fixed frequency by a proper sequence of voltage at the input terminals thus allowing a given output frequency to be held constant for long periods of time.

Obviously many modifications and variations of the present invention are possible in the light of the above teachings. It is therefore to be understood that within the scope of the appended claims the invention may be practiced otherwise than as specifically described.

What is claimed is:

1. In a variable frequency oscillator circuit having an output frequency that is dependent upon digital logic input information, the combination comprising:

an input circuit adapted to receive positive input signals;

first, second, third and fourth semi-conductor diode means having their anodes coupled to receive said input signals;

first bistable means coupled to the cathodes of said first and second semiconductor diode means, said first bistable means responsive to the presence of of an input signal to have first and second stable conditions, respectively, for providing a first and second output signal;

second bistable means coupled to the cathodes of said third and fourth semiconductor diode means, said second bistable means responsive to the presence of an input signal to have first and second stable conditions, respectively, for providing a first and second output signal;

said second bistable means adapted to be switched from said first to said second stable conditions responsive to the presence of a positive signal in said input circuit, integrator circuit means electrically coupled to said first bistable means and said second bistable means for providing integration of said first and second output signals from said first bistable means and second bistable means, respectively;

voltage controlled oscillator means coupled to receive the output signal of said intergrator circuit means;

said voltage controlled oscillator means responsive to oscillate at predetermined frequencies responsive to signals from said first and second bistable means; and a wave shaping circuit coupled to said oscillator for providing a symmetrical pulse output.

2. In a variable frequency oscillator circuit having an output frequency that is dependent upon digital logic input information the combination comprising:

first, second and third input circuits adapted to receive first, second and third positive input pulses;

first diode means having its anode electrically coupled to said first input circuit means;

second and third diode means having their respective anodes coupled to said third input circuit means;

fourth diode means having its anode electrically coupled to said second input circuit means;

first, second and third transistor means having base, emitter and collector electrodes;

said base electrode of said first transistor means electrically coupled to the cathodes of said first and second diode means;

said base electrode of said second transistor electrically coupled to the cathodes of said third and fourth diode means;

said collector electrode of said second transistor electrically coupled to the base electrode of said third transistor;

first Zener diode electrically coupling the emitter electrode of said first transistor and the emitter of said second transistor to positive potential;

second Zener diode electrically coupling the emitter of said third transistor to negative potential;

integrator circuit means having its input electrically coupled to the collector electrodes of said first and third transistor for providing integration of the output signal from the respective collector electrodes; and voltage controlled oscillator means responsive to receive the output signal of said integrator means;

whereby, a positive pulse received by the second input circuit provides a positive voltage output to said integrator circuit means and a positive pulse on the first input circuit provides a negative voltage output at the input of said integrator circuit means, thereby causing said integrator to sweep negative on the positive voltage and positive on the negative voltage, thus causing the integrator output voltage to vary to provide a frequency shift in the voltage controlled oscillator means.

3. In a variable frequency oscillator circuit having an output frequency that is dependent upon digital logic input information, the combination comprising:

a plurality of input means;

polarity shifting means electrically connected to said plurality of input means and having first, second, third and fourth diode means having cathode and anode electrodes;

first, second and third bistable means, said first bistable means coupled to the respective cathodes of said first and second diode means and said second bistable means coupled to the respective cathodes of said third and fourth diodes and the base of the third bistable means, said bistable means responsive to receive a plurality of predetermined combinations of digital voltage input signals for shifting the output signal polarity in a predetermined manner responsive to each combination of digital input voltages;

integrator means responsive to the signal polarity of said polarity shifting means; and voltage control oscillator means coupled to said integrator means and responsive to the polarity and magnitude of a signal from said integrator means.

References Cited by the Examiner

UNITED STATES PATENTS

| | | | |
|---|---|---|---|
| 2,747,097 | 5/1956 | Naidich | 331—26 |
| 2,982,920 | 5/1961 | Feissel | 331—17 |

OTHER REFERENCES

Edwards et al.: AIEE, "Transistor Phase-Locked Oscillators," vol. 77, Part I, TK-1A6-1958, pages 1043–1051.

ROY LAKE, *Primary Examiner.*

JOHN KOMINSKI, *Examiner.*